(12) United States Patent
Gradinger et al.

(10) Patent No.: US 10,390,459 B2
(45) Date of Patent: Aug. 20, 2019

(54) ARRANGEMENT FOR COOLING COMPONENTS OF A SUBSEA ELECTRIC SYSTEM

(71) Applicant: ABB Schweiz AG, Baden (CH)

(72) Inventors: Thomas Gradinger, Aarau Rohr (CH); Tor Laneryd, Enköping (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/128,864

(22) PCT Filed: Mar. 3, 2015

(86) PCT No.: PCT/EP2015/054413
§ 371 (c)(1),
(2) Date: Sep. 23, 2016

(87) PCT Pub. No.: WO2015/150007
PCT Pub. Date: Oct. 8, 2015

(65) Prior Publication Data
US 2017/0112021 A1    Apr. 20, 2017

(30) Foreign Application Priority Data
Apr. 4, 2014   (EP) .................................. 14163566

(51) Int. Cl.
*H05K 7/20*      (2006.01)
*F28F 13/12*     (2006.01)
(Continued)

(52) U.S. Cl.
CPC ......... *H05K 7/20263* (2013.01); *F28D 1/022* (2013.01); *F28D 15/00* (2013.01);
(Continued)

(58) Field of Classification Search
CPC ............ H05K 7/20236; H05K 7/20272; H01L 23/476; H01L 23/44; H01L 23/46
(Continued)

(56) References Cited

U.S. PATENT DOCUMENTS 6,145,584 A * 11/2000 Baynes .................... F28D 15/02
165/104.19
6,488,079 B2 * 12/2002 Zifferer ...................... F28F 1/06
165/133

(Continued)

FOREIGN PATENT DOCUMENTS

CN            101443724 A      5/2009
EP           2487326 A1 *     8/2012 ......... E21B 41/0007
(Continued)

OTHER PUBLICATIONS

PC Power INC, How PC Power Supplies Work, Mar. 5, 2001, (https://computer.howstuffworks.com/power-supply1.htm).*

(Continued)

*Primary Examiner* — Dion Ferguson
*Assistant Examiner* — Amir A Jalali
(74) *Attorney, Agent, or Firm* — Whitmyer IP Group LLC

(57) ABSTRACT

An arrangement for cooling components of a subsea electric system including a tank filled with a dielectric fluid. The tank includes first and second sections. The arrangement includes one first electric component within the first section, and one second electric component within the second section. The arrangement includes a first heat exchanger located outside the tank and in fluid contact with the tank, and arranged during operation to be in thermal contact with sea water. The arrangement includes a pump arranged to force a flow of dielectric fluid through the first heat exchanger. Flow of dielectric fluid in the tank is by both natural and forced convection generated by the pump. The first electric com- (Continued)

ponent generates more heat than the second electric component. Within the first section the share of the flow by natural convection is greater than within the second section.

20 Claims, 4 Drawing Sheets

(51) Int. Cl.
*F28D 1/02* (2006.01)
*F28D 15/00* (2006.01)
*H05K 5/00* (2006.01)

(52) U.S. Cl.
CPC ............ *F28F 13/12* (2013.01); *H05K 5/0017* (2013.01); *H05K 7/20236* (2013.01); *H05K 7/20245* (2013.01); *H05K 7/20272* (2013.01); *H05K 7/20409* (2013.01); *H05K 7/20927* (2013.01)

(58) Field of Classification Search
USPC .......... 361/699, 701; 165/80.4–80.5, 104.33; 174/547–548; 257/714
See application file for complete search history.

(56) References Cited

U.S. PATENT DOCUMENTS

| | | | |
|---|---|---|---|
| 7,983,041 B2 * | 7/2011 | Godfroy | H05K 5/06 165/104.33 |
| 9,056,663 B2 * | 6/2015 | Bo | B63G 8/08 |
| 9,386,729 B2 * | 7/2016 | Baerd | H05K 7/20272 |
| 2006/0118279 A1 * | 6/2006 | Stafford | F28D 1/024 165/104.33 |
| 2007/0267741 A1 * | 11/2007 | Attlesey | G06F 1/20 257/714 |
| 2008/0302115 A1 * | 12/2008 | Eknes | H05K 5/068 62/183 |
| 2009/0232664 A1 * | 9/2009 | Qu | H02K 5/1285 417/44.1 |
| 2012/0189472 A1 * | 7/2012 | McDonald | B63G 8/001 417/372 |
| 2013/0056181 A1 * | 3/2013 | Baerd | H05K 7/20927 165/104.33 |
| 2015/0216080 A1 * | 7/2015 | Chan | H05K 7/20236 361/700 |

FOREIGN PATENT DOCUMENTS

| | | | | |
|---|---|---|---|---|
| EP | 2487327 A1 | | 8/2012 | |
| EP | 2533621 A1 | | 12/2012 | |
| EP | 2782434 A1 | * | 9/2014 | ............. H05K 5/067 |
| EP | 2803813 A1 | * | 11/2014 | ......... E21B 41/0007 |
| EP | 2825008 A1 | | 1/2015 | |
| EP | 2826565 A1 | * | 1/2015 | ......... H05K 7/20236 |
| EP | 2919571 A1 | * | 9/2015 | ......... H05K 7/20927 |

OTHER PUBLICATIONS

M. Bahrani, Natural Convection, Jan. 20, 2012, (https://www.sfu.ca/~mbahrami/ENSC%20388/Notes/Natural%20Convection.pdf).*
European Search Report Application No. EP 14 16 3566 Completed: Sep. 15, 2014; dated Sep. 24, 2014 6 pages.
International Search Report and Written Opinion of the International Searching Authority Application No. PCT/EP2015/054413 Completed: May 7, 2015; dated May 19, 2015 10 pages.
China Office Action Application No. 2015800178539 dated Oct. 8, 2018.

* cited by examiner

ARRANGEMENT FOR COOLING COMPONENTS OF A SUBSEA ELECTRIC SYSTEM

TECHNICAL FIELD

The invention relates to cooling arrangements, and particularly to arrangements for cooling components of a subsea electric system, and to a subsea electric system comprising such an arrangement.

BACKGROUND

In general terms, electric subsea installations and devices usually demand high standards regarding durability, long-term functionality and independence during operation. Electric subsea installations that need to be cooled during operation, such as subsea converters, require an autonomous and durable cooling of its components. It is known to use a dielectric liquid of low compressibility such as for example mineral oil as a cooling fluid. The dielectric fluid could also be composed of natural or synthetic esters. In general terms, the dielectric fluid is used to provide a pressure compensated environment, and additionally functions as an electric insulation medium of electric components, such as capacitor units, placed in the electric installation.

The tanks of power-electronic subsea equipment, such as subsea converters, are thus typically filled with oil, which acts as a combined electric insulation and cooling medium. To improve the cooling for high-loss electric components such as power semiconductors, these electric components are typically attached to heat sinks, through which the oil flows. The oil receives heat from the internal converter components and may transfer it to the sea water through the tank surface. Generally, the tank surface alone is not sufficient for the cooling and the cooling capacity can be augmented by a sea-water heat exchanger located outside the tank. To improve the cooling for high-loss electric components such as power semiconductors, these electric components are typically attached to heat sinks, through which the oil flows.

Because of the high reliability requested for the subsea converters, it may be advantageous to have a passive cooling system for the subsea converter, i.e., a cooling system without the need for a pump. The oil in the tank and in any oil-to-sea-water heat exchanger can be moved by natural convection. Also the sea water cooling the oil-to-sea-water heat exchanger may be moved by natural convection. Ideally it may thus be desirable to move the oil by natural convection only, to eliminate the pump as a component that has a finite lifetime and that may fail. One issue with oil-natural-convection cooling is, however, the limited efficiency.

Generally, dielectric fluids such as mineral oil have high viscosity and low thermal conductivity. Furthermore, the natural convection flow rate of a typical dielectric fluid in a heat exchanger is generally in the laminar regime. Typical cooling systems for subsea power-electronic equipment are thus limited by the high thermal resistance between the cooling fluid and the wall necessitating a large heat-transfer surface. A sea-water heat exchanger may be preferably manufactured from circular pipes, since this is a semi-finished product form in which typical heat exchanger materials such as stainless steel are readily available. However, the pipes cannot have a too small inner diameter. Otherwise, due to the wall thickness needed, the steel cross-section would be large compared to the oil-flow cross-section, making the heat exchanger heavy and costly. Respecting a sufficient inner diameter, however, generally makes the heat transfer from oil to inner tube wall poor (due to laminar flow and low thermal conductivity of the oil).

To keep the pressure drop low enough for natural convection, there should be a sufficient oil-flow cross-section (e.g., many parallel pipes) and the pipes should not be too long. In particular, coiled-tube heat exchangers, enabling long tubes, cannot be used. Each tube must be connected to a manifold at both of its ends (e.g., by welding). Many tubes connected in parallel result in a large number of connections (typically welds). There may be in the order of thousand connections for large converters. Since providing the connections requires manual work, this means high cost, next to the challenge of keeping all connections tight.

US 20130056181 discloses a deionized-water cooling system for electrical equipment, connected electrically to a primary power supply. The system includes a main circuit to channel and cool the deionized water intended to circulate within the electrical equipment; a main pumping system; a main power source; a deionization circuit connected at two points to the main circuit and including a deionizer; a secondary pumping system to circulate the deionized water in the deionizer, and a secondary power source, which secondary power source has less power than the main power source. US 20120189472 discloses a hydraulic power unit for subsea use. The power unit includes a housing containing a fluid, an electric motor mounted in the housing, a distribution pump, a heat exchange unit provided externally to the housing and at least one distribution conduit in fluid communication with the heat exchange unit and the housing While such systems may be thermally efficient, they require oil channels to be built around the components to cool, or the heat sinks to which they are attached. The oil in the channels is under overpressure with respect to the oil around the channels. So, the channel walls need to be strong and tight enough to sustain this overpressure. In addition, the channel walls must be thermally insulating to limit the heat transfer from high-loss components that may get hotter, to low-loss components that are more temperature sensitive. This significantly adds to the mechanical complexity of the system.

Consequently, the cooling efficiency is limited, and the design of an economical cooling system may thus be challenging. Hence there is a need for efficient subsea cooling of electric components in subsea applications.

SUMMARY

An object of embodiments herein is to provide efficient mechanisms for subsea cooling of electric components in subsea applications.

Natural convection is less efficient than forced oil cooling and limited by the pressure drop in the system. One main bottleneck is the sea-water heat exchanger. The average temperature in the tank is high, causing premature ageing of temperature sensitive electric components. Further, because of corrosion, the tank wall is usually made from stainless steel, which has a rather low thermal conductivity (around 10 W/m K). As a consequence, the tank wall cannot spread the heat from the electric components well.

A particular object of embodiments herein is therefore to provide efficient mechanisms for subsea cooling of electric components in subsea applications but without the above noted disadvantages.

Particularly, according to a first aspect there is presented an arrangement for cooling components of a subsea electric system. The arrangement comprises a tank filled with a dielectric fluid. The tank comprises a first section and a second section. The arrangement comprises at least one first electric component located within the first section. The arrangement comprises at least one second electric component located within the second section. The arrangement comprises a first heat exchanger located outside the tank and in fluid contact with the tank, and arranged to during operation be in thermal contact with sea water. The arrangement comprises a pump arranged to force a flow of the dielectric fluid through the first heat exchanger. Flow of the dielectric fluid in the tank is partially by natural convection and partially by forced convection generated by the pump. The at least one first electric component generates more heat than the at least one second electric component. Within the first section the share of the flow by natural convection is greater than within the second section.

Advantageously, such an arrangement enables efficient subsea cooling of electric components in subsea applications. Advantageously, such an arrangement enables reduced ageing of temperature sensitive electric components.

The cooling is efficient since the pump compensates the largest pressure drop in the flow of the dielectric fluid, i.e., where the dielectric fluid is passed through the first heat exchanger. Advantageously, such an arrangement thus allows for a cheap, light, and compact first heat exchanger.

According to a second aspect there is presented a subsea power-electronic converter unit comprising an arrangement according to the first aspect.

Advantageously, the subsea power-electronic converter unit can have a high power rating.

It is to be noted that any feature of the first or second aspects may be applied to any other aspect, wherever appropriate. Likewise, any advantage of the first aspect may equally apply to the second aspect, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

DETAILED DESCRIPTION

Figure 1:
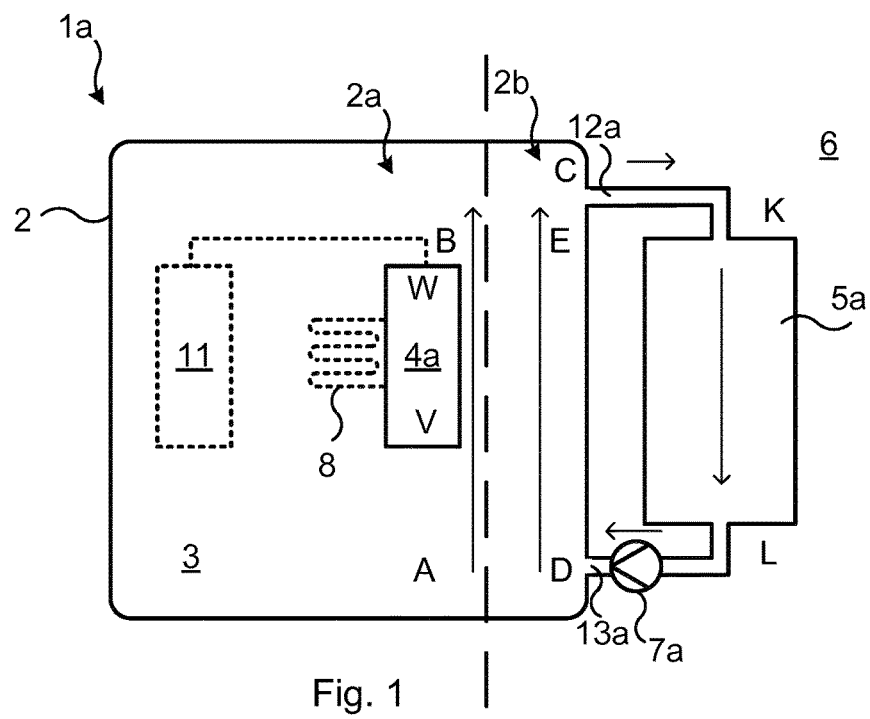
FIGS. 1, 2, 3, and 4 schematically illustrate arrangements for cooling components of a subsea electric system according to embodiments.
Figure 2:
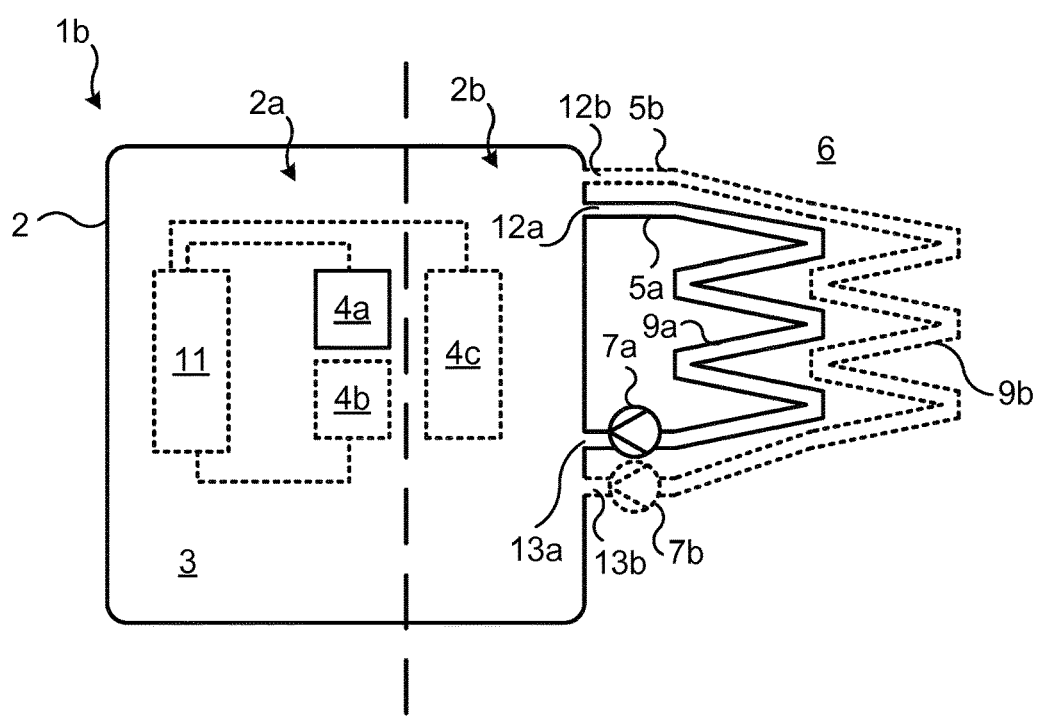
Figure 3:
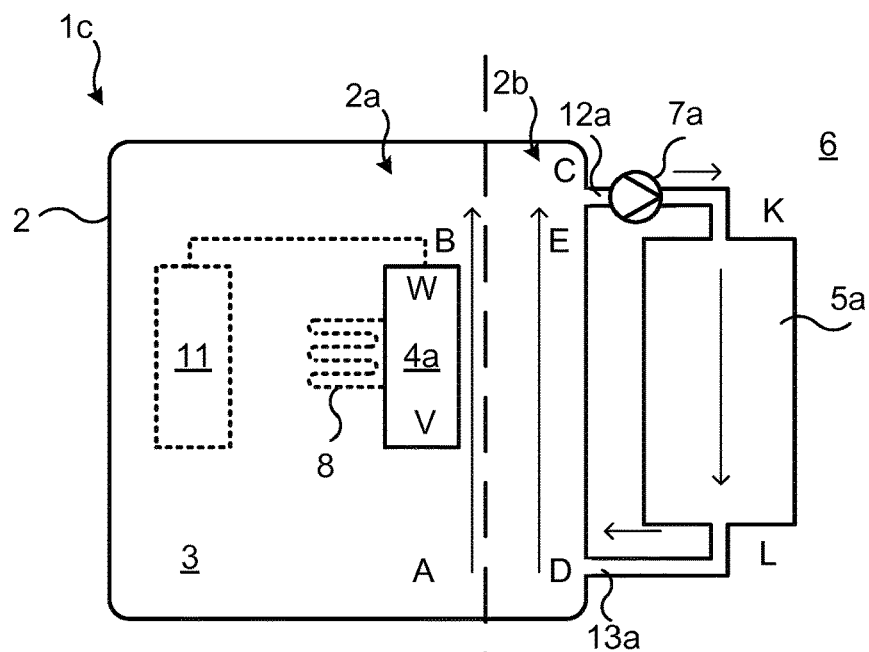
Figure 4:
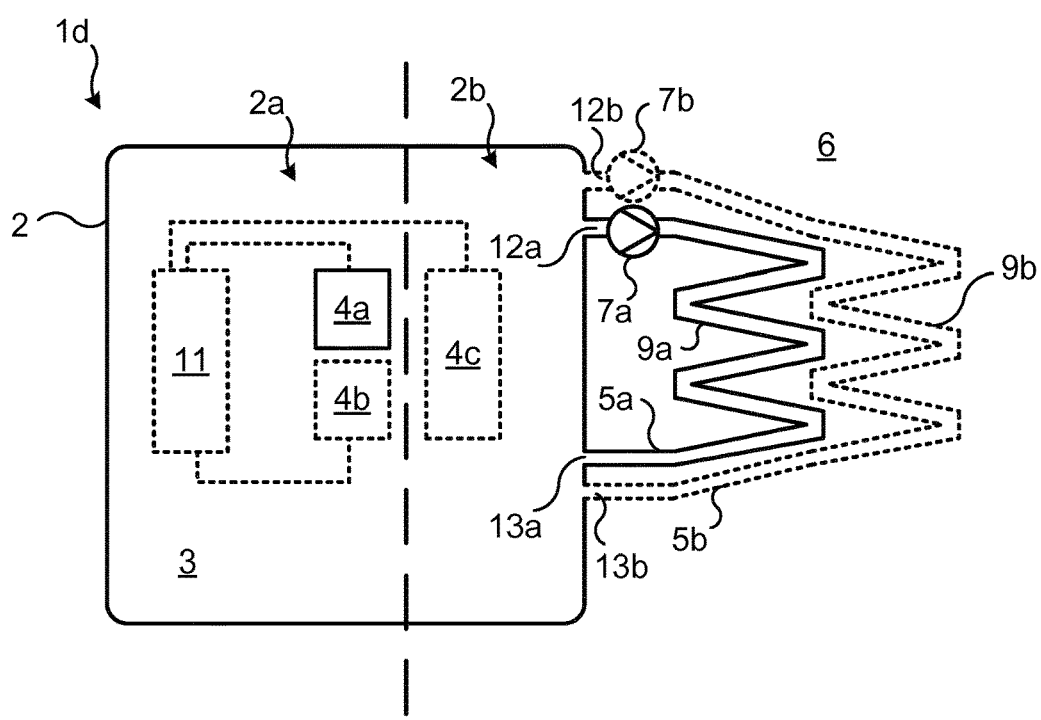

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Cooling systems for electric equipment, and specifically for subsea electric system, are used to cool down electric components, such as power electronic building blocks, semiconductor modules, connectors and capacitor units. Such electric components generate heat that needs to be dissipated by the cooling system. The cooling systems of subsea power-electronic converter units are usually designed in a simple manner avoiding any unnecessary parts and mechanisms. Generally it is desirable to have passive cooling systems, thus cooling systems without any driven or powered parts, such as for example without pumps, to cool down the electric equipment. In some cases natural convection is used but it has a low efficiency. Cooling by natural convection uses the heat transfer from the cooling liquid to the surrounding sea water to generate circulation within the cooling system and thus within the electric installation and the subsea power-electronic converter unit.

Reference is now made to FIGS. 1, 2, 3, and 4. FIGS. 1, 2, 3, and 4 are cross-sectional side views illustrating arrangements 1a, 1b, 1c, 1d for cooling components of a subsea electric system.

In general terms, there is provided an arrangement 1a, 1b, 1c, 1d for cooling components of a subsea electric system for a subsea installation where a dielectric fluid 3, such as oil, is pumped through a first heat exchanger 5a, 5b and into a tank 2 using a pump system, whilst the dielectric fluid 3 in the tank 2 is circulating by natural convection. Due to the larger allowable pressure drop, the performance of the first heat exchanger 5a, 5b can be made efficient by using long tubes 9a, 9b (such as a coiled-tube heat exchanger) and/or internal surface extensions or static mixers.

Particular details of arrangements 1a, 1b, 1c, 1d for cooling components of a subsea electric system will now be disclosed.

The arrangement 1a, 1b, 1c, 1d comprises a tank 2. The tank 2 is filled with a dielectric fluid 3. The tank comprises a first section 2a and a second section 2b. In FIGS. 1-4 the first section 2a and the second section 2b are schematically separated by a symbolic dashed vertical line. The arrangement 1a, 1b, 1c, 1d comprises at least one first electric component 4a extending between a top end W and a bottom end V. The at least one first electric component 4a is located within the first section 2a. The arrangement 1a, 1b, 1c, 1d comprises at least one second electric component 4c. The at least one second electric component 4c is located within second section 2b. The at least one first electric component 4a generates more heat than the at least one second electric component 4c.

The arrangement 1a, 1b, 1c, 1d comprises a first heat exchanger 5a. The first heat exchanger 5a is located outside the tank 2. The first heat exchanger 5a is in fluid contact with the tank 2. The first heat exchanger 5a is arranged to during operation be in thermal contact with sea water 6. The arrangement 1a, 1b, 1c, 1d comprises a pump 7a. The pump 7a is arranged to force a flow of the dielectric fluid 3 through the first heat exchanger 5a along path K-L.

In use, components such as electric components 4a, 4c generate heat. In general terms, for some electric components 4a, 4c increased temperature is a common stress factor. In subsea environments, such as in subsea power-electronic converter units, which require high reliability, the thermal stress should thus be limited to a minimum. In the at least one electric component 4*a* energy is dissipated during operation. This energy is conducted to the outer walls of the at least one first and second electric component 4*a*, 4*c*, where it is transported to the surroundings, such as to a dielectric fluid 3 surrounding the at least one first and second electric component 4*a*, 4*c*. From the dielectric fluid 3 heat is transferred to the surrounding water. In more detail, heat from the dielectric fluid 3 is transferred to the first heat exchanger 5*a* and then from the first heat exchanger 5*a* to the water surrounding the tank 2. Efficient cooling of the at least one electric component 4*a* enables the at least one first and second electric component 4*a*, 4*c* hotspot temperature to be limited.

Flow of the dielectric fluid 3 in the tank 2 is partially by natural convection and partially by forced convection generated by the pump 7*a*. Particularly, within the first section 2*a* the share of the flow by natural convection is greater than (the share of the flow by natural convection) within the second section 2*b*.

The arrangement 1*a*, 1*b*, 1*c*, 1*d* may thus be configured such that during operation the dielectric fluid 3 receives heat from the at least one first and second electric component 4*a*, 4*c*, flows from the tank 2 into the first heat exchanger 5*a*, flows through the first heat exchanger 5*a* to transfer heat to the sea water 6, and flows back from the first heat exchanger 5*a* into the tank 2. The first heat exchanger 5*a* may thus be regarded as an oil-to-sea-water heat exchanger. The pump 7*a* is arranged to force a flow of the dielectric fluid 3 through the first heat exchanger 5*a*. In the arrangements 1*a* and 1*b* the pump 7*a* is arranged such that the dielectric fluid 3 flows back from the first heat exchanger 5*a* into the tank 2 through the pump 7*a*. In the arrangements 1*c* and 1*d* the pump 7*a* is arranged such that the dielectric fluid 3 flows from the tank 2 through the pump 7*a* into the first heat exchanger 5*a*.

The subsea electric system may thus be arranged such that in use the at least one first and second electric component 4*a*, 4*c* is passively pressurized to the hydrostatic pressure level of the ambient sea water (increasing by 1 bar each 10 m, typically 100 to 300 bar for subsea installations under consideration). This may achieved by filling a thin-walled pressure-compensated tank 2 with a dielectric fluid 3 of negligible compressibility. Alternatively the walls of the tank 2 are thick (and hence the tank needs not to pressure-compensated), thereby enabling the at least one electric component 4*a* to stay at atmospheric pressure. Hence, according to one embodiment the tank 2 is a (thin-walled) pressure-compensated tank and according to one embodiment the tank 2 is a (thick-walled) non-pressure-compensated tank.

Common power electronic devices on and may have pumped deionized water or air cooling systems but then the cooling fluid is pumped through the heat sinks of the loss generating components. This is different from the present arrangement 1*a*, 1*b*, 1*c*, 1*d* where the cooling fluid cools the components in the tank through natural convection, and there is only forced convection through the first heat exchanger. The dielectric fluid 3 may be oil. The operating principle of the arrangement 1*a* is apparent from FIG. 1. The pump 7*a* is used to compensate the oil-pressure drop over the first (oil-to-sea-water) heat exchanger 5*a*. This means that the pump 7*a* forces the flow through the first (oil-to-sea-water) heat exchanger. In contrast, the flow of the dielectric fluid 3 in the tank 2 is partly by natural convection and partly by the pump 7*a*. The application of the oil-forced principle to converters is sketched in FIG. 7, see below.

Since the at least one first and second electric component 4*a*, 4*c* in the tank 2 are, at different shares, cooled by natural convection, even with switched-off pumps 7*a* the arrangement will work for a limited time at full power and indefinitely at a reduced power level. The speed of the pump 7*a* may be set to be just slightly higher than the corresponding natural convective flow (through the stack of at least one heat sink 8) because then the temperature in the entire tank 2 will be uniformly cold which could be useful for electric components 4*a* such as capacitors that require a low temperature environment. In general terms the at least one first electric component 4*a* may be a power electronic component. More particularly, the at least one first electric component 4*a* may be any of a switchgear, a breaker, a transformer, a tap changer, and a capacitor.

Embodiments relating to further details of the arrangements 1*a* and 1*b* for cooling components of a subsea electric system will now be disclosed.

Figure 5:
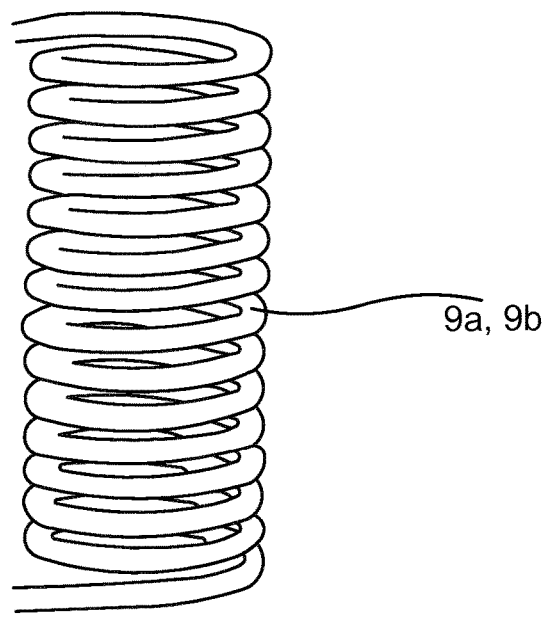
FIG. 5 schematically illustrates a coiled-tube heat exchanger.
Figure 6:
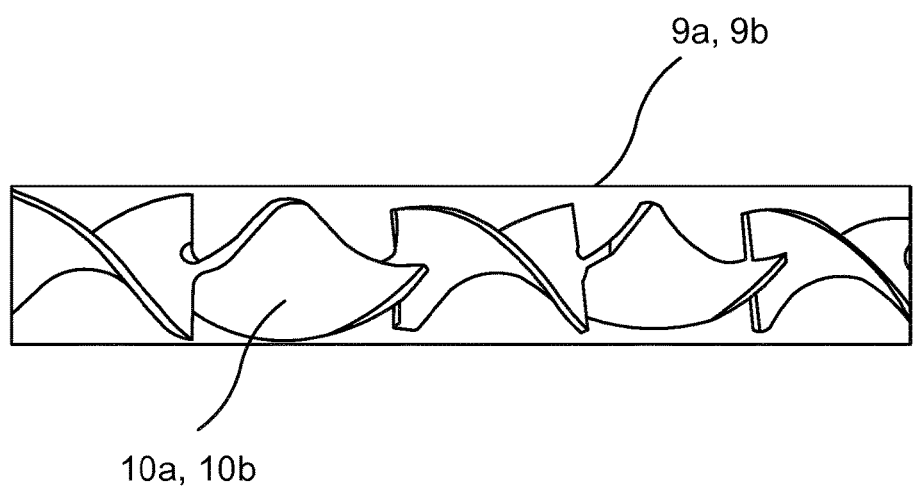
FIG. 6 schematically illustrates a helical static mixer.

According to a first general embodiment, the first heat exchanger 5*a* is of a coiled-tube type, as shown in FIGS. 5, 6. Hence, according to the first general embodiment the first heat exchanger 5*a* comprises at least one tube 9*a* through which the dielectric fluid 3 flows. One or several tubes such as tube 9*a*, and/or tube 9*b* may be formed as a coil or a spiral. Hence each tube 9*a* may be shaped like a coil or a spiral. Shaping the at least one tube 9*a* as a coil or a spiral is a means of accommodating a long tube 9*a* within a small volume. For natural-convection cooling of sea water 6, the coil axis should, during operation, be oriented vertically. In general terms, the sea water 6 rises along the inner and outer surface of the cylinder formed by the coil.

One advantage of having a coiled tube 9*a* is that many straight, short tubes, which are connected in parallel (by inlet and outlet manifolds) may be replaced by few long coiled tubes 9*a*, 9*b*. The few long coiled tubes 9*a*, 9*b* have the same total heat-transfer area as the many straight, short tubes. Reducing the number of tubes (whilst keeping the heat-transfer area constant) may be advantageous, since every tube 9*a*, 9*b* generally needs to be manually connected to the manifolds, e.g., by welds.

One advantage of pumped oil cooling as herein disclosed is that it enables the use of coiled-tube oil-to-sea-water heat exchangers. Without pumping, the pressure drop in long coiled tubes 9*a*, 9*b* would be prohibitively high.

According to a second general embodiment, the first heat exchanger 5*a* is provided with means for mixing the dielectric fluid 3 flowing through the first heat exchanger 5*a*. Hence, the first heat exchanger 5*a* may comprise mixing means 10*a*, 10*b* for mixing the flow of the dielectric fluid 3 in the tube 9*a*, 9*b*; each tube 9*a*, 9*b* thus comprises a corresponding mixing means 10*a*, 10*b*. The mixing means 10*a*, 10*b* may act like static mixers. One example of a static mixer is the helical static mixer, an example of which is schematically illustrated in FIG. 6 where one part of the mixing means is arranged with a first rotation direction e.g., clockwise, and where another part of the mixing means is arranged with a rotation in the opposite rotation direction, e.g., anti-clockwise. For helical static mixers the mixing means 10*a*, 10*b* consists of helical blades with alternating sense of rotation. Hence the mixing means 10*a*, 10*b* may comprise alternating helices.

For helical static mixers, the trailing edge and the leading edge of meeting blades are offset by 90°. Such mixers are very efficient in exchanging the position of fluid particles within the flow cross-section; i.e., they bring particles near the center close to the tube wall and vice versa. Hence, the heat transfer from the dielectric fluid 3 to the inner walls of the first heat exchanger 5*a* is greatly improved. Pumping of the dielectric fluid 3 as herein disclosed is an enabler for using such mixing means 10a, 10b. Without pumping, the pressure drop would be prohibitively high. Using mixing means 10a, 10b may significantly reduce the needed heat-transfer area, i.e. the length and/or number of first heat exchangers 5a, 5b, yielding a smaller and more economic first heat exchanger.

The second overall embodiment may be readily combined with the first overall embodiment. Thus, tubes 9a of the first heat exchanger 5a may be filled with the above disclosed means for mixing the dielectric fluid 3 flowing through the tubes 9a of the first heat exchanger 5a. For example, a helix as schematically illustrated in FIG. 6 can be made flexible, either from plastic or from thin metal, such that it can be pushed into a coiled tube 9a. Good thermal or mechanical contact between helix and tube 9a wall is not required, and mounting is easy.

According to a third general embodiment, a multitude of first (oil-to-sea-water) heat exchangers 5a, 5b are connected to the tank 2, through which the dielectric fluid 3 flows in parallel. Hence, according to the third general embodiment the arrangement 1a, 1b, 1c, 1d further comprises at least one further first heat exchanger 5b located outside the tank 2 and in fluid contact with the tank 2, and arranged to during operation be in thermal contact with sea water 6.

Each first heat exchanger 5a, 5b may have its own pump 7a, 7b. That is, each at least one further first heat exchanger 5b may be provided with a respective pump 7b arranged to force a flow of the dielectric fluid 3 through its respective first heat exchanger 5b. If one pump 7a fails, the other heat exchangers 5b may continue to operate at full efficiency. Particularly, the arrangement 1a, 1b, 1c, 1d may be designed in a redundant way, such that operation at full load can be continued even after a certain number of pumps 7a have failed. Several pumps 7a, 7b can be part of a redundant system with easy access if repairs are required. Requirements on robustness may thus be upheld by redundancy in the pump system.

The third overall embodiment may be readily combined with the first overall embodiment and/or the second overall embodiment. Thus, each first heat exchanger 5a, 5b may be of the coiled-tube type and/or provided with means for mixing the dielectric fluid 3.

According to a fourth general embodiment, electric components 4a may be attached to second heat exchangers 8 that transfer the heat efficiently from component to the dielectric fluid 3. Thus, according to the fourth general embodiment the arrangement 1a, 1b, 1c, 1d further comprises at least one second heat exchanger 8. The at least one second heat exchanger 8 is located inside the tank 2. The at least one second heat exchanger 8 is in thermal connection with at least one of the at least one electric component 4a. This may be particularly advantageous for electric components 4a that have high losses and/or high loss density (and therefore may require efficient cooling).

The dielectric fluid 3 flows through the at least one second heat exchanger 8 by natural convection. Hence the flow of the dielectric fluid 3 through the at least one second heat exchanger 8 is by natural convection. Each one of the at least one second heat exchanger 8 may be a heat-sink, such as a finned heat-sink. The at least one second heat exchanger 8 may be clamped to electric components 4a such as IGBT modules.

For example, the arrangement 1a, 1b, 1c, 1d may comprise at least two first high loss generating electric components 4a, 4b provided in an essentially vertical stack cooled by natural convection. The flow in the first heat exchanger 5a, 5b will increase due to the relative increased effect of buoyancy as compared to the colder average dielectric fluid 3 in the tank 2. The temperature difference between vertically stacked first electric components 4a, 4b would then be reduced.

For example, the at least one second electric component 4c may be a temperature sensitive, low loss generating electric component 4c. The second section 2b may be defined by a separate flow path in the tank 2, wherein for a common mean fluid velocity, frictional pressure drop through the low-loss generating electric component 4c, is lower than that through the at least one first high-loss generating electric component 4a, 4b. The separate flow path is inside the tank 2 itself.

The fourth overall embodiment may be readily combined with the first overall embodiment, the second overall embodiment, and/or the third overall embodiment. Thus, there may be provided an arrangement 1a, 1b, 1c, 1d where each first heat exchanger 5a, 5b is of the coiled-tube type and/or is provided with means for mixing the dielectric fluid 3 and where the electric components 4a, 4b, 4c, such as vertically stacked electric components 4a, 4b, 4c, are attached to second heat exchangers 8.

According to a fifth general embodiment any of the herein disclosed arrangements 1a, 1b, 1c, 1d further comprises an electrical control system 11. Hence the fifth overall embodiment may be readily combined with the first overall embodiment, the second overall embodiment, the third overall embodiment, and/or the fourth overall embodiment. The electrical control system 11 is provided in the tank 2 and is connected to the at least one electric component 4a, 4b, 4c. According to an embodiment the electrical system is a subsea power-electronic converter unit. The electrical control system may comprise at least one of any of a switchgear, a breaker, a transformer, a tap changer, and a capacitor.

The mixing means 10a, 10b may be controlled by a monitoring and control system, thereby enabling the mixing means 10a, 10b to regulate power of the subsea electric system.

In general terms, the dielectric fluid 3 flows from the tank 2 into the first heat exchanger 5a, 5b at an outlet 12a, 12b of the tank 2 and flows back into the tank 2 from the first heat exchanger 5a, 5b at an inlet 13a, 13b of the tank 2.

According to a sixth general embodiment any of the herein disclosed arrangements 1a, 1b, 1c, 1d are, during operation, vertically oriented. In other words, each first heat exchanger 5a, 5b is vertically arranged in relation to the tank 2. This means that during operation the outlet 12a, 12b is located vertically higher than the inlet 13a, 13b. That is, according to the sixth general embodiment any of the herein disclosed arrangements 1a, 1b, 1c, 1d are, during operation, configured such that the dielectric fluid flows substantially vertically down through the first heat exchanger 5a, 5b.

According to a seventh general embodiment any of the herein disclosed arrangements 1a, 1b, 1c, 1d are, during operation, configured such that the natural convection flow of the dielectric fluid 3 in the tank 2 and around the at least one first and second electric components 4a, 4c and the flow of the dielectric fluid through the first heat exchanger 5a, 5b form a continuous flow.

Figure 7:
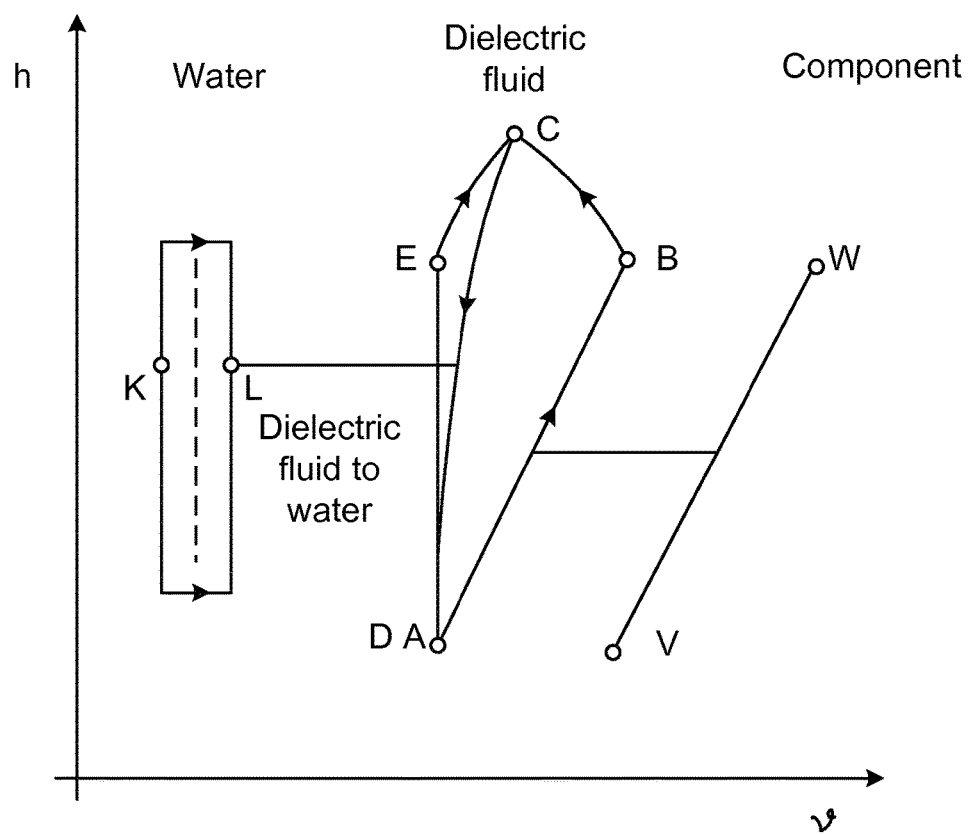
FIG. 7 schematically illustrates cooling performance of the arrangement in FIG. 1 for cooling components of a subsea power-electronic converter unit.

Parallel references are now made to FIG. 1 and FIG. 7. FIG. 7 schematically illustrates cooling performance of the arrangement 1a in FIG. 1. In FIG. 7, the x-axis is specific volume v (i.e., the reciprocal of density), and the y-axis is enthalpy h.

As noted in FIG. 7, the cooling performance of the first heat exchanger 5a, 5b leads to low temperature of the dielectric fluid 3 at the tank bottom, i.e., temperature of the dielectric fluid 3 at locations A and D.

The temperature will be low throughout the entire tank 2 up to location C, due to the increased mass flow rate of the pumped flow of the dielectric fluid 3 in combination with the low pressure drop of path D-E compared to path A-B. This means that low-loss electric components (in FIG. 7 "Component") that are temperature sensitive can be placed directly in the tank 2. For a pure natural convection system there is no significant flow of the dielectric fluid 3 in the tank 2 and the tank temperature at the top of the tank 2 is therefore significantly higher than the tank temperature at the bottom of the tank 2.

Although the pump 7a, 7b contributes only little to the forced convection for the path A-B the flow of the dielectric fluid 3 is still considerably higher than for natural convection that would take place in the absence of the pump 7a, 7b due to the lower tank temperature which corresponds to a larger pressure gradient across the tank 2.

Within the tank 2, the design is very simple. No special means to guide the flow are necessary. The flow through the electric component to cool is driven by the lower density of the dielectric fluid 3 in path A-B compared to the density of the dielectric fluid 3 in path D-E.

The invention has mainly been described above with reference to a few embodiments. However, as is readily appreciated by a person skilled in the art, other embodiments than the ones disclosed above are equally possible within the scope of the invention, as defined by the appended patent claims. For example, although oil has been used as an example of the dielectric fluid 3, it is understood that any suitable dielectric fluid 3 could be used.

The invention claimed is:

1. An arrangement for cooling components of a subsea electric system, comprising:
    a tank configured for installation in subsea water, the tank filled with a dielectric fluid, the tank comprising a first section and a second section;
    at least one first electric component located within the first section;
    at least one second electric component located within the second section;
    a first heat exchanger located outside the tank and in fluid contact with the tank, and arranged to during operation be in thermal contact with the subsea water; and
    a pump arranged to force a flow of the dielectric fluid through the first heat exchanger;
    wherein the flow of the dielectric fluid in the tank is by natural convection and by forced convection generated by the pump;
    wherein the dielectric fluid flows from the tank into the first heat exchanger at an outlet of the tank, and the dielectric fluid flows back into the tank from the first heat exchanger at an inlet of the tank, wherein both the outlet and the inlet of the tank are located in the second section of the tank:
    wherein the at least one first electric component generates more heat than the at least one second electric component, and in that within the first section a share of the flow by natural convection is greater than within the second section.

2. The arrangement according to claim 1, further comprising at least one further first heat exchanger located outside the tank and in fluid contact with the tank, and arranged to during operation be in thermal contact with the subsea water.

3. The arrangement according to claim 2, wherein each first heat exchanger is provided with a respective pump arranged to force a flow of the dielectric fluid through its respective first heat exchanger.

4. The arrangement according to claim 1, further comprising at least one second heat exchanger located inside the tank and in thermal connection with at least one of the electric components.

5. The arrangement according to claim 4, wherein the flow of dielectric fluid through the at least one second heat exchanger is by natural convection.

6. The arrangement according to claim 4, wherein the at least one second heat exchanger is a heat sink, such as a finned heat sink.

7. The arrangement according to claim 1, wherein at least two first high-loss generating electric components are provided in a vertical stack in the first section.

8. The arrangement according to claim 1, wherein at least one second temperature sensitive, low-loss generating electric component is provided in the second section.

9. The arrangement according to claim 1, wherein the second section is defined by a separate flow path, and wherein for a common mean fluid velocity, frictional pressure drop through the at least one second electric component is lower than that through the at least one first electric component.

10. The arrangement according to claim 9, wherein the separate flow path is inside the tank itself.

11. The arrangement according to claim 1, wherein the first heat exchanger comprises at least one tube through which the dielectric fluid flows.

12. The arrangement according to claim 11, wherein the at least one tube is shaped like a coil or a spiral.

13. The arrangement according to claim 1, wherein the first heat exchanger comprises a mixer configured to mix the flow of the dielectric fluid through the first heat exchanger.

14. The arrangement according to claim 13, wherein the mixer is a static mixer comprising alternating helices.

15. The arrangement according to claim 1, further comprising:
    an electrical control system, the electrical control system being provided in the tank and connected to the at least one electric component.

16. The arrangement according to claim 15, wherein the electrical control system is a subsea power-electronic converter unit.

17. The arrangement according to claim 15, wherein the electrical control system comprises at least one of any of: a switchgear, a breaker, a transformer, a tap changer, and a capacitor.

18. The arrangement according to claim 1, wherein the at least one first electric component is any of: a switchgear, a breaker, a transformer, a tap changer, and a capacitor.

19. The arrangement according to claim 1, wherein the arrangement is configured such that during operation the outlet is located vertically higher than the inlet.

20. The arrangement according to claim 1, wherein the pump is located outside the tank.

* * * * *